US008724939B2

(12) United States Patent
Shastri et al.

(10) Patent No.: US 8,724,939 B2
(45) Date of Patent: May 13, 2014

(54) ENHANCED LOW INDUCTANCE INTERCONNECTIONS BETWEEN ELECTRONIC AND OPTO-ELECTRONIC INTEGRATED CIRCUITS

(75) Inventors: Kalpendu Shastri, Orefield, PA (US); Bipin Dama, Bridgewater, NJ (US); Mark Webster, Bethlehem, PA (US); David Piede, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 216 days.

(21) Appl. No.: 13/421,833

(22) Filed: Mar. 15, 2012

(65) Prior Publication Data
US 2012/0237160 A1 Sep. 20, 2012

Related U.S. Application Data

(60) Provisional application No. 61/454,198, filed on Mar. 18, 2011.

(51) Int. Cl.
*G02B 6/12* (2006.01)
*G02F 1/01* (2006.01)
*G02F 1/035* (2006.01)

(52) U.S. Cl.
USPC .................. 385/14; 385/1; 385/32; 385/3

(58) Field of Classification Search
None
See application file for complete search history.

(56) References Cited

U.S. PATENT DOCUMENTS

| | | | |
|---|---|---|---|
| 3,784,883 A | 1/1974 | Duncan et al. | |
| 3,784,884 A | 1/1974 | Zoroglu | |
| 5,717,547 A | 2/1998 | Young | |
| 6,821,128 B2 | 11/2004 | Belopolsky et al. | |
| 7,088,009 B2 | 8/2006 | Hagen | |
| 7,483,597 B2 * | 1/2009 | Shastri et al. | 385/3 |
| 7,683,480 B2 | 3/2010 | Bokatius et al. | |
| 7,872,325 B2 | 1/2011 | Ho et al. | |
| 8,320,720 B2 * | 11/2012 | Webster et al. | 385/14 |
| 8,520,984 B2 * | 8/2013 | Webster et al. | 385/2 |
| 2002/0102056 A1 * | 8/2002 | Koehl et al. | 385/40 |
| 2005/0067187 A1 | 3/2005 | Hsu | |
| 2007/0237444 A1 * | 10/2007 | Keil | 385/3 |
| 2007/0289764 A1 | 12/2007 | Douma et al. | |
| 2008/0116553 A1 | 5/2008 | Rossi | |
| 2010/0316324 A1 * | 12/2010 | Webster et al. | 385/2 |
| 2011/0044573 A1 * | 2/2011 | Webster et al. | 385/3 |
| 2012/0230626 A1 * | 9/2012 | Metz et al. | 385/3 |
| 2012/0237160 A1 * | 9/2012 | Shastri et al. | 385/14 |

FOREIGN PATENT DOCUMENTS

JP 2011-076645 4/2011

\* cited by examiner

*Primary Examiner* — Rhonda Peace
(74) *Attorney, Agent, or Firm* — Patterson & Sheridan LLP

(57) ABSTRACT

A configuration for routing electrical signals between a conventional electronic integrated circuit (IC) and an opto-electronic subassembly is formed as an array of signal paths carrying oppositely-signed signals on adjacent paths to lower the inductance associated with the connection between the IC and the opto-electronic subassembly. The array of signal paths can take the form of an array of wirebonds between the IC and the subassembly, an array of conductive traces formed on the opto-electronic subassembly, or both.

6 Claims, 5 Drawing Sheets

# ENHANCED LOW INDUCTANCE INTERCONNECTIONS BETWEEN ELECTRONIC AND OPTO-ELECTRONIC INTEGRATED CIRCUITS

CROSS-REFERENCE TO RELATED APPLICATIONS

This application claims the benefit of U.S. Provisional Application No. 61/454,198, filed Mar. 18, 2011 and herein incorporated by reference.

TECHNICAL FIELD

The present invention relates to a configuration for routing electrical signals between a conventional electronic integrated circuit (IC) and an opto-electronic subassembly and, more particularly, to the use of an array of signal paths carrying oppositely-signed signals on adjacent paths to lower the inductance associated with the connection between the IC and the opto-electronic subassembly.

BACKGROUND OF THE INVENTION

Wirebonds have been used for many years to provide electrical signal connections from one integrated circuit to another. In conventional electronic circuit arrangements, there are often a large number of signals that are passed between signals.

In the field of opto-electronics, wirebond connections may also be used to create the data signal path from an electronic integrated circuit to an opto-electronic subassembly. FIG. 1 is a simplified diagram of this arrangement, illustrating an interconnected opto-electronic subassembly 10 and electronic IC 20. In this case, a pair of wirebonds 30, 32 is used to provide a digital data signal and its complement (hereinafter referred to as DATA and $\overline{\text{DATA}}$), generated on electronic IC 20, as a signal pair to opto-electronic subassembly 10, where this signal pair may thereafter be used, in this case, to control the operation of an optical modulator (not shown). FIG. 2 is top view of this prior art arrangement.

It has been found that wirebond connections do not perform well at very high data and/or symbol rates (for example, in excess of 10 GHz). Indeed, the imaginary impedance Z of a wirebond connection can be on the order of j62Ω for a data rate of 10 GHz, where $$Z = j2\pi * f * L.$$

In this example, L (inductance) has a value of approximately 1 nH for a wirebond having a length of about 1 mm and a diameter of 25 μm. As operational speeds increase, it is clear that the higher values of the imaginary impedance will ultimately limit the operating speed of the device.

One solution to this problem is to eliminate the use of wirebonds, and instead connect the IC to the opto-electronic subassembly using the well-known "flip chip" arrangement. In this case, IC 20 would be "flipped over" and mounted face-to-face on the top surface of opto-electronic subassembly 10. Inasmuch as many opto-electronic subassemblies can generate substantial amounts of heat, the use of flip-chip arrangements is not considered practical in all cases. There may be other problems associated with using a flip-chip method.

As a result, there is a continuing need to provide an improved configuration for interconnecting an electronic integrated circuit and an opto-electronic integrated circuit, particularly as data rates continue to increase.

SUMMARY OF THE INVENTION

The needs remaining in the prior art are addressed by the present invention, which relates to a configuration for routing electrical signals between a conventional electronic integrated circuit (IC) and an opto-electronic subassembly and, more particularly, to the use of an array of signal paths carrying oppositely-signed signals on adjacent paths to lower the inductance associated with the connection between the IC and the opto-electronic subassembly.

In accordance with a first embodiment of the present invention, a plurality of wirebonds may be used to provide a connection array between the IC and opto-electronic subassembly. A first set of wirebonds is used to carry the data signal desired to be transmitted to the opto-electronic subassembly (hereinafter referred to as "DATA") and a second set of wirebonds is used to carry the complement (hereinafter referred to as "$\overline{\text{DATA}}$"). The two sets are interleaved (i.e., interdigitated) to form a wirebond array, where adjacent wirebonds are carrying oppositely-signed signals. As a result of the complementary signaling arrangement, the mutual inductance between adjacent wirebonds is significantly reduced when compared to prior art connection arrangements, where the reduction in inductance allows for higher data rates to be used with fewer problems. The "set" may be as few as a pair of wirebonds, but is preferably more, since having a wirebond surrounded on both sides by oppositely-signed signals will reduce the mutual inductance even further.

In a second embodiment of the present invention, a pair of wirebonds may be used to bring the data signal onto the opto-electronic subassembly from the electronic IC, with an array of interdigitated conductive signal paths (metal traces) created on the opto-electronic subassembly to thereafter bring the incoming data signal from the edge of the subassembly to the optical modulator (or other device) which is located at a distance from the edge of the subassembly. Again, the conductive signal paths are created and connected together such that adjacent traces carry opposite-signed signals, lowering the mutual inductance associated with the conductive signal signals.

Indeed, it is preferred to combine the configurations of the first and second embodiments, using both an array of wirebonds and an array of conductive traces to interconnect an electronic IC and an opto-electronic subassembly, since this arrangement will provide the lowest possible inductance (as a function of the number of wirebonds and traces used to form the signal paths; indeed, the number of wirebonds need not necessarily be the same as the number of traces).

The arrayed connection of the present invention may be utilized with various types of opto-electronic modulators including, without limitation, modulators that include multiple modulating sections formed along the arms of the modulator. In this case, an array connection is preferably used with each individual modulating section.

Indeed, a particular embodiment of the present invention comprises an arrangement for providing a low inductance electrical connection between an electronic integrated circuit and an opto-electronic subassembly for communicating a complementary-encoded data signal therebetween, defined as a DATA signal component and a $\overline{\text{DATA}}$ signal component comprising an array of parallel signal paths disposed between the electronic integrated circuit and a predetermined location on the opto-electronic subassembly and including a first set of signal paths for carrying the DATA signal component and a second set of signal paths for carrying the $\overline{\text{DATA}}$ signal component, wherein the signal paths forming the first set and the second set are interleaved such that oppositely-signed signals are carried on adjacent signal paths so as to create a low mutual inductance within the array of parallel signal paths.

Other and further embodiments and configurations of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

The present invention addresses the prior art concerns associated with the use of wirebond connections in high speed opto-electronic circuit applications. In particular, the present invention relates to a configuration for routing electrical signals between a conventional electronic integrated circuit (IC) and an opto-electronic subassembly using an array of connections, with the DATA and $\overline{\text{DATA}}$ signals transmitted on adjacent paths (i.e., in an "interleaved" or "interdigitated" configuration) to lower the inductance associated with the overall connection between the IC and the opto-electronic subassembly.

As will be described in detail hereinbelow, the "array" connection of the present invention may take the form of a plurality wirebonds transmitting the DATA and $\overline{\text{DATA}}$ signals from the electronic IC to the opto-electronic subassembly, a plurality of conductive signal paths along the opto-electronic subassembly from the location where the signals from the electronic IC interface the subassembly to the opto-electronic device (e.g., optical modulator) or, preferably, a combination of both a plurality of wirebonds and a plurality of conductive traces. Moreover, the array connection arrangement of the present invention can be used with various types of opto-electronic modulators including, for example, multi-segment modulators, as will be discussed hereinbelow in association with FIG. 6.

First, however, the basic utilization of an array of interdigitated signal paths to lower inductance associated with a connection between an electronic integrated circuit and an opto-electronic subassembly will be described.

Figure 3:
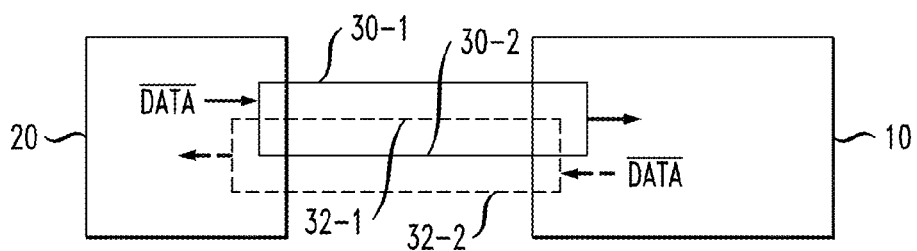
FIG. 3 is a top view of a first exemplary embodiment of the present invention, in this case using a pair of wirebonds for each of the data connections between the IC and the opto-electronic subassembly.

FIG. 3 illustrates an exemplary embodiment of the present invention where a first pair of wirebonds 30-1, 30-2 is used to provide the DATA signal between IC 20 and opto-electronic subassembly 10, and a second pair of wirebonds 32-1, 32-2 is used to provide the $\overline{\text{DATA}}$ signal. For the sake of illustration only, wirebonds 32-1 and 32-2 are shown as dotted lines to clearly illustrate how the DATA and $\overline{\text{DATA}}$ wirebonds are alternated in placement to create the interdigitated configuration.

Figure 1:
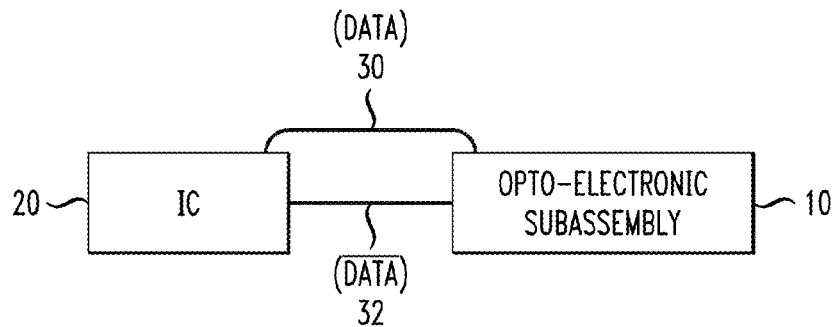
FIG. 1 is a side view of an exemplary prior art arrangement for interconnecting an electrical integrated circuit (IC) with a separate opto-electronic subassembly.
Figure 2:
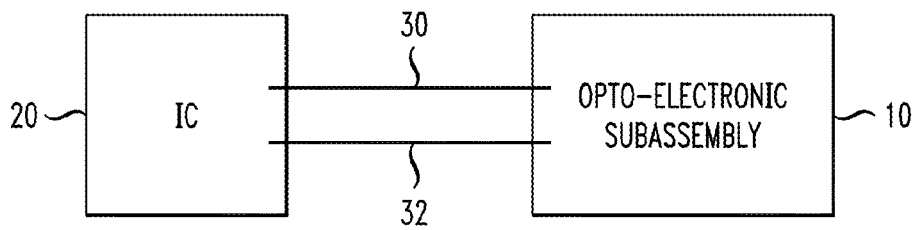
FIG. 2 is a top view of the arrangement of FIG. 1.

Indeed, it has been found that an array of interdigitated wirebonds, as shown in the embodiment of FIG. 3, exhibits an improved performance (in terms of lower inductance) over the conventional "single pair" wirebond connection arrangement, as shown in prior art FIGS. 1 and 2. That is, by virtue of creating an additional oppositely-signed mutual inductance $L_{mutual}$ (opposite in sign by having a wirebond carrying, for example, the $\overline{\text{DATA}}$ signal always adjacent to at least two wirebonds carrying, for example, the DATA signal), the total inductance $L_{total}$ will be reduced. In particular, $L_{total} = L_{self} + L_{mutual}$, where $L_{self}$ is defined as the self-inductance associated with a single wire and $L_{mutual}$ is the mutual inductance between a pair of adjacent wires as defined above.

In general, the utilization of an array of wirebonds creates a mutual inductance between any pair of adjacent wirebonds. As long as the wirebonds are disposed in a complementary array (i.e., a DATA wirebond next to a $\overline{\text{DATA}}$ wirebond), the overall inductance will be reduced compared to the use of a simple pair of wirebonds to provide these complementary signals. In particular, the inductance can be defined as follows:

$$L = \mu_0 * \frac{\ell}{\pi} * \ln\left(\frac{d}{2r} + \sqrt{\left(\frac{d^2}{4r^2}\right) - 1}\right),$$

where $\mu_0$ is the permeability constant, l is the length of the wirebond, r is the radius of the wirebond, and d is the distance between adjacent wirebonds (center-to-center). Presuming each wirebond is 1 mm in length and has a radius of 10 μm, and that there is a 60 μm spacing between adjacent wirebonds, $L_{self}$ is about 1.0 nH and $L_{mutual}$ is about −0.3 nH, yielding an $L_{total}$ of about 0.7 nH. The overall inductance for wirebond array of FIG. 3 (having a total of four wirebonds) is therefore on the order of approximately 1.4 nH. This is compared to a conventional inductance of about 2.0 nH for a typical prior art configuration.

Figure 4:
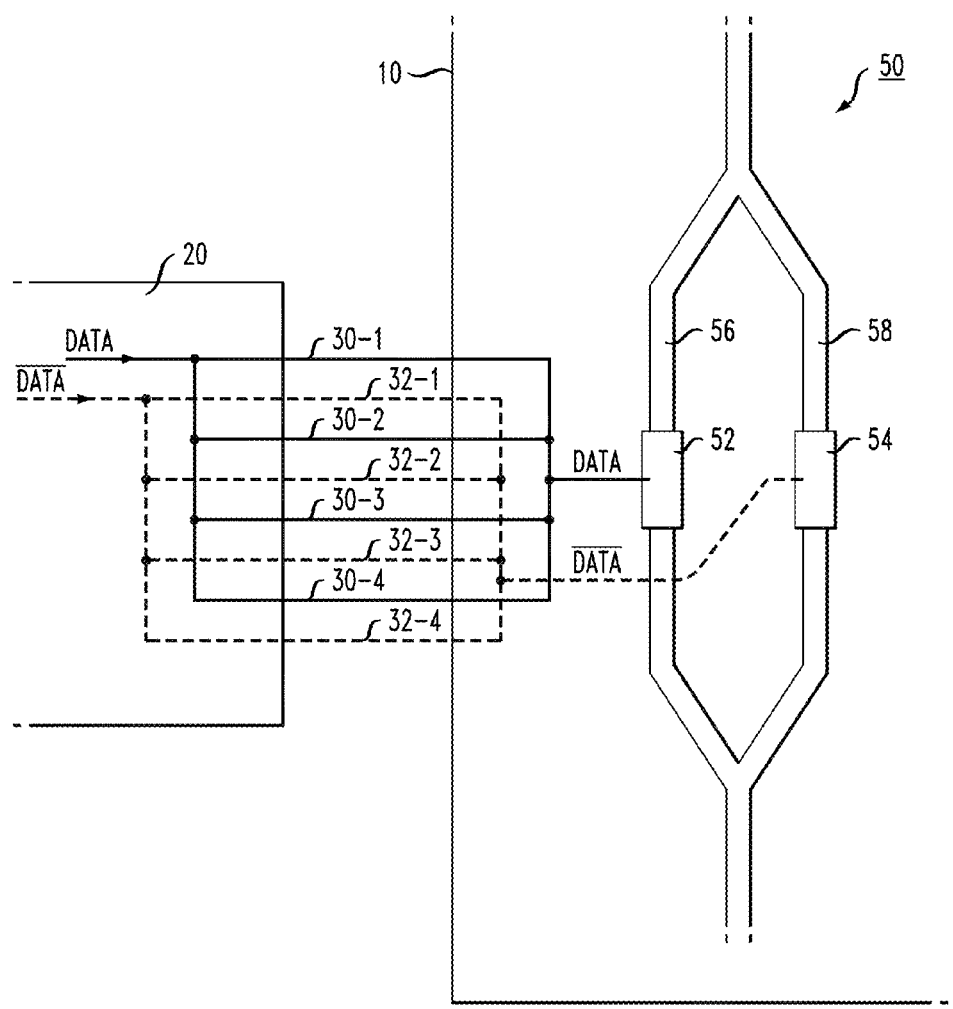
FIG. 4 is a top view of an alternative embodiment, utilizing a set of four separate wirebonds to form both the DATA and $\overline{\text{DATA}}$ connections between the IC and the opto-electronic subassembly, where this particular view shows in detail the interdigitated nature of the wirebond array connection, where oppositely-signed signals are conducted along adjacent signal paths.

In accordance with the present invention, a further improvement (lowering) in the overall inductance—creating the ability to transmit even higher data rate signals—is provided by increasing the number of individual connections used to form the array connection used to transmit the complementary DATA and $\overline{\text{DATA}}$ signal pair between IC 20 and opto-electronic subassembly 10. FIG. 4 illustrates an embodiment of the present invention using a larger number of individual signal paths, in this example the array connection includes a first set of four wirebonds 30-1, 30-2, 30-3 and 30-4 used to transmit the DATA signal from IC 20 to opto-electronic sub-assembly 10 and a second set of four wirebonds 32-1, 32-2, 32-3 and 32-4 used to transmit the $\overline{\text{DATA}}$ signal from IC 20 to opto-electronic subassembly 10. The arrangement of FIG. 4 also illustrates an exemplary electro-optic modulator 50 formed as part of opto-electronic subassembly 10, where the DATA and $\overline{\text{DATA}}$ signals are applied as separate inputs to modulating sections 52 and 54 formed along optical signal waveguiding arms 56 and 58, respectively. For the sake of clarity, the connection between $\overline{\text{DATA}}$ and modulating section 54 is shown as a dotted line, where it is to be understood that the electrical signal path (conductive trace) is integrated within the opto-electronic subassembly and is, perhaps, formed on a layer of the structure above the silicon layer used to form the actual optical waveguiding structure.

In this case, there is an additional reduction in inductance associated with the "inner" bonds (i.e., all of the wirebonds except for 30-1 and 32-4), since there are two neighboring wirebonds supporting signal flow in the opposite direction. That is, for the "inner" wirebonds, $L_{total}$ becomes $L_{self}$-$2*L_{mutual}$, or about 0.4 nH for the above example. This relationship holds true for the majority of the wirebonds in the arrangement of FIG. 4 (that is, for each wirebond except for 30-1 and 32-4) since, for example, wirebond 30-3 (used to transmit the DATA signal) is adjacent to both wirebonds 32-2 and 32-3, each supporting the transmission of the $\overline{\text{DATA}}$ signal. This type of configuration (with inner wirebonds surrounded by a pair of oppositely-driven wirebonds) is considered to reduce the overall inductance by an additional 33 to 50% per wire.

Figure 5:
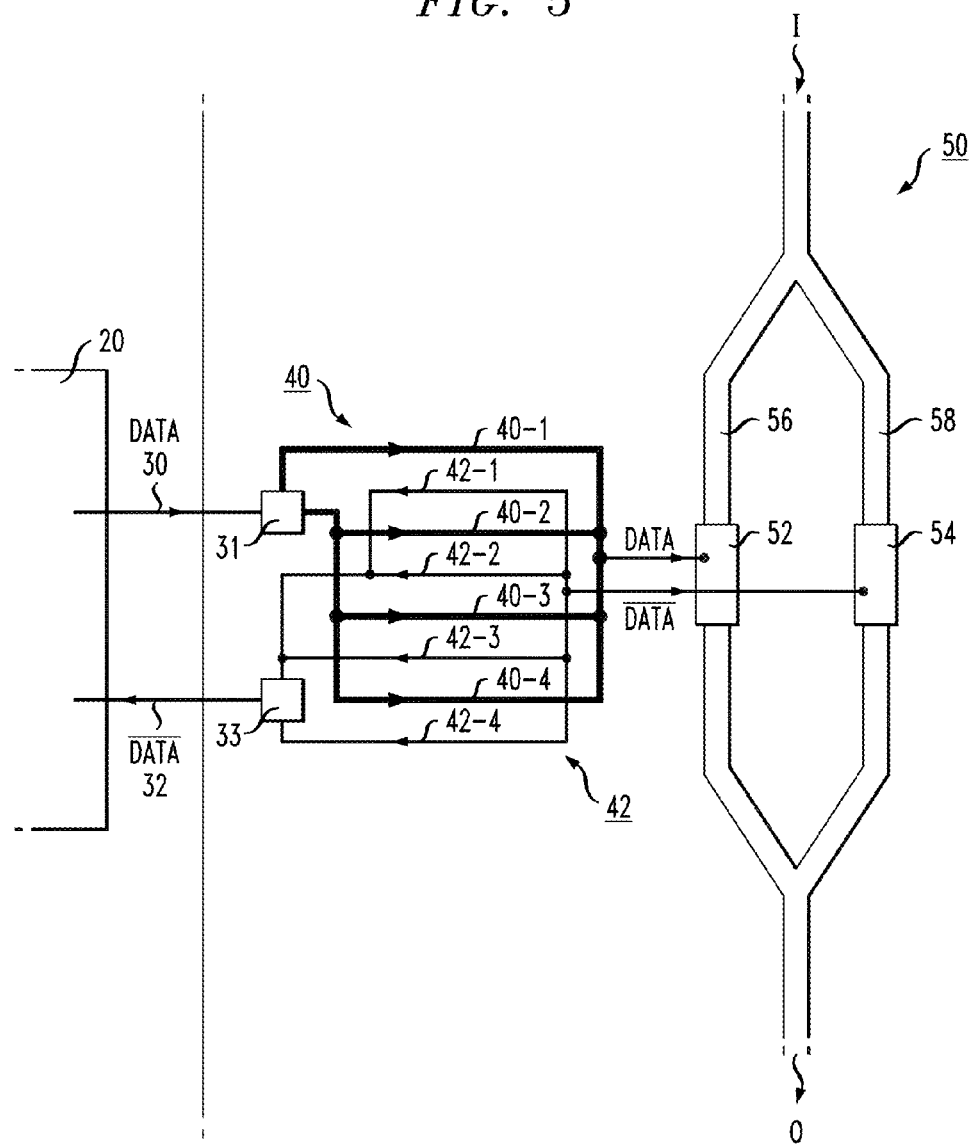
FIG. 5 is a top view of yet another embodiment of the present invention, in this case utilizing arrays of conductive signal paths on the opto-electronic subassembly to provide the DATA and $\overline{\text{DATA}}$ input signals to an optical modulator, where the use of arrays of conductive signal paths will reduce the inductance present on the incoming data signal, in accordance with the present invention.

As mentioned above, an alternative embodiment of the present invention which may be used to reduce the inductance associated with the connection between IC 20 and opto-electronic subassembly 10 comprises the use of an array connection of conductive signal paths (e.g., metal traces) formed on the surface of opto-electronic subassembly 10. In this particular arrangement, the array connection of conductive traces is used to bring the incoming DATA and $\overline{\text{DATA}}$ signals from the "edge" of subassembly 10 to the modulating sections 52 and 54 of modulator 50. FIG. 5 illustrates one exemplary arrangement of this alternative embodiment. In this particular configuration, a single wirebond pair 30, 32 is used to transmit the data signal from IC 20 to opto-electronic subassembly 10. In accordance with the present invention, subassembly 10 is processed to create an array connection that comprises a first set of traces 40 used to conduct the incoming DATA signal and a second set of traces 42 used to conduct the incoming $\overline{\text{DATA}}$ signal. In further accordance with the present invention, the individual traces forming each set are interleaved in the manner shown in FIG. 5 so that oppositely-signed signals are carried on adjacent conductors (traces 40 being somewhat darkened in FIG. 5 only to illustrate the interleaving—all conductors are generally formed of the same material). Again, this arrangement will significantly reduce the mutual inductance of the connection. The specific values of the inductance may be easily determined by those skilled in the art, based upon properties of traces 40, 42, their geometry and the properties of the surrounding materials (silicon, dielectric, etc.).

Referring to the particular embodiment of FIG. 5, it is shown that the incoming DATA signal is conducted across wirebond 30, which terminates at a bondpad 31 on opto-electronic subassembly 10. A first set of conductive traces 40-1, 40-2, 40-3 and 40-4 thereafter branch out from bondpad 31, where each will carry the same DATA signal. Upon reaching the location of optical modulator 50, the set of traces 40 will combined, with the DATA signal then applied as an input modulating section 52. In a similar fashion, the $\overline{\text{DATA}}$ signal travels along wirebond 32, which terminates at a bondpad 33 on opto-electronic subassembly 10. A second set of conductors 42-1, 42-2, 42-3 and 42-4, coupled to bondpad 33 will thereafter carry the DATA signal and apply it as an input to modulating device 54 of optical modulator 50. For the sake of clarity only, the conductors forming the set of traces 42 are shown as dotted lines, illustrating the interdigitated configuration of the array connection, which provides for the reduction in the mutual inductance.

Figure 6:
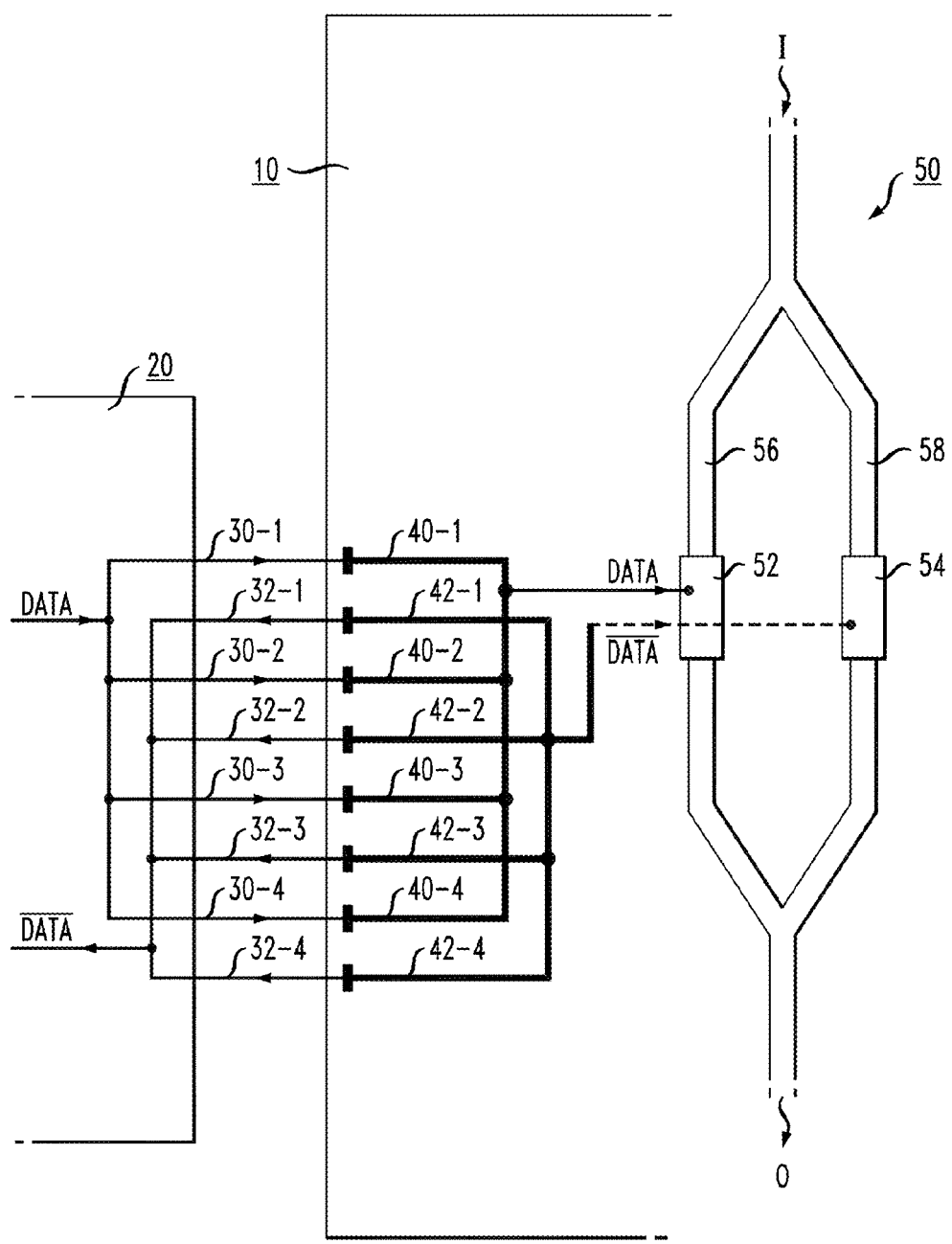
FIG. 6 illustrates a preferred embodiment of the present invention, utilizing both the wirebond array connection of FIG. 4 and the conductive signal path array connection of FIG. 5.

In a preferred embodiment of the present invention, both an array of wirebond connections and an array of conductive traces are used to interconnect IC 10 and opto-electronic subassembly 20, since this provides the lowest inductance (for a given number of separate signal paths). FIG. 6 illustrates this preferred embodiment, including both an array of wirebond connections 30, 32 and an array of conductive traces 40, 42. While the number of traces is shown to be the same as the number of wirebonds, it is to be understood that this is exemplary only, and any desired number of individual signal paths can be used to form the sets. In one case, for example, there may be only a relatively small area on the edge of IC 10 where a of individual wirebonds may be formed, but on the opto-electronic subassembly there room for a substantially larger number of conductive traces. As long as at least a pair of wirebonds and a pair traces are used, the benefits of lowering the mutual inductance of the connection will result.

While the embodiments described above illustrate a relatively simple optical modulator 50 that may benefit from the use of reduced inductance on the applied input signals (in terms of increase the modulator's speed), the same array connection of the present invention can be used with a multi-segment modulator. As described in various prior art references (such as, for example, U.S. Pat. No. 7,483,597 entitled "Optical Modulator Utilizing Multi-Level Signaling" and assigned to the assignee of this application), a multi-segment optical modulator may be used to allow for a multi-level data signal to be transmitted by the modulator, where each symbol that is transmitted represents multiple data bits.

Figure 7:
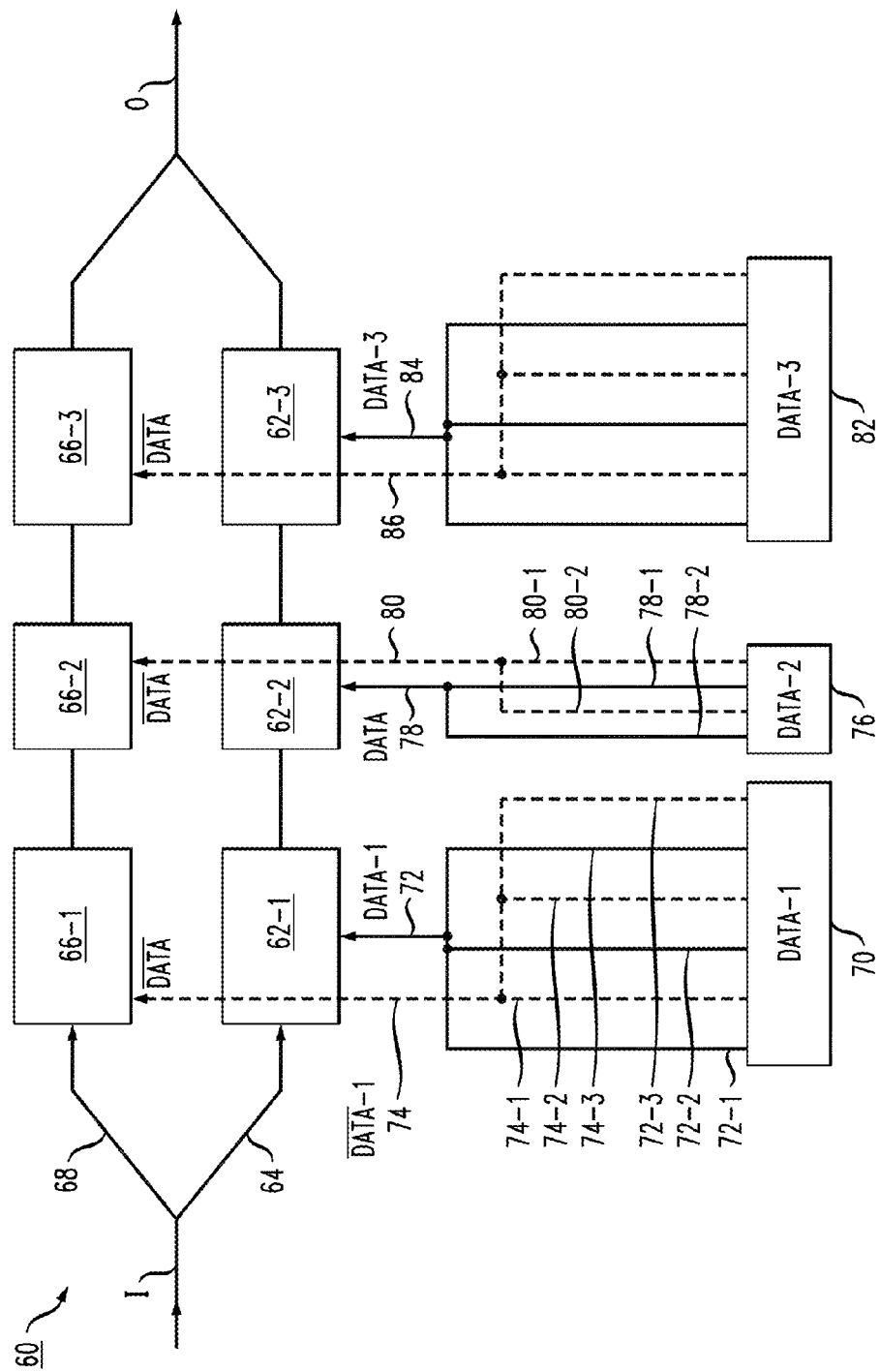
FIG. 7 is a high-level diagram of yet another embodiment of the present invention, in this case associated with a segmented optical modulator and utilizing a separate array connection as a data signal input to each modulating section.

FIG. 7 illustrates an exemplary embodiment of the present invention as used with a multi-segment optical modulator 60. As shown, optical modulator 60 includes a first plurality of modulating sections 62-1, 62-2 and 62-3 formed along a first modulator arm 64 and a second plurality of modulating sections 66-1, 66-2 and 66-3 formed along a second modulator arm 68. In this particular embodiment, sections 62-2 and 66-2 are formed to be shorter than the remaining sections, thus introducing a different incremental phase shift to the propagating optical signal.

In accordance with the present invention, arrayed connections of separate signals are applied as inputs to each pair of modulating sections (the "separate" data signals may indeed be three different data signals, or separate copies of the same data input signal). It is to be assumed that these arrayed connections may take the form of arrays of wirebonds, arrays of conductive paths on the subassembly, or both. The individual connections are merely shown as single lines on the diagram of FIG. 7 for the sake of illustration. Moreover, as shown in FIG. 7, it is possible to modify the specific number of individual signal paths forming the array connections associated with each pair of modulating sections. In this particular embodiment, a first array connection 70 is associated with modulating section pair 62-1, 66-1 and is shown to comprise a first set of three paths 72-1, 72-2 and 72-3 forming a DATA-1 connection (defining a first data input signal) to modulating section 62-1 and a second set of three data paths 74-1, 74-2 and 74-3 forming the $\overline{\text{DATA-1}}$ connection to modulating section 66-1.

A second array connection 76 is associated with modulating section pair 62-2, 66-2 and, in this particular example, comprises only pairs of connections (which, as discussed above in association with FIG. 3, does provide an improvement in lowering inductance with respect to prior art arrangements). These connections are shown as 78-1 and 78-2 for a DATA-2 connection (defining a second data input signal) to modulating section 62-2, with connections 80-1 and 80-2 used for the $\overline{\text{DATA-2}}$ signal paths. Lastly, the array connection 82 associated with the pair of modulating sections 62-3, 66-3 is similar to array connection 70 described above, and includes a first set of signal paths 84 associated with a DATA-3 signal and a second set of signal paths 86 associated with the $\overline{\text{DATA-3}}$ signal.

It should be appreciated that the exemplary embodiments described above are merely illustrative of the subject matter of the present invention, and various other configurations will be apparent to those skilled in the art and considered to fall within the spirit and scope of the present invention as defined by the claims appended hereto.

What is claimed is:

1. An arrangement for providing a low inductance electrical connection between an electronic integrated circuit and an opto-electronic subassembly for communicating a complementary-encoded data signal therebetween, defined as a DATA signal component and a $\overline{\text{DATA}}$ signal component, the arrangement comprising
    an array of parallel signal paths disposed between the electronic integrated circuit and a predetermined location on the opto-electronic subassembly, the array including
        a first set of signal paths for carrying the DATA signal component; and
        a second set of signal paths for carrying the $\overline{\text{DATA}}$ signal component, wherein the signal paths forming the first set and the second set are interleaved such that oppositely-signed signals are carried on adjacent signal paths so as to create a low inductance within the array of parallel signal paths.

2. An arrangement as defined in claim 1 wherein the array of parallel signal paths comprises an array of wirebonds formed between the electronic integrated circuit and a plurality of separate bondpads on the opto-electronic subassembly, with the wirebonds forming the first set disposed in an interleaved configuration with the wirebonds forming the second set.

3. An arrangement as defined in claim 1 wherein the array of parallel signal paths comprises an array of conductive traces formed within the opto-electronic subassembly, a first set of conductive traces coupled to receive the DATA signal component from the electronic integrated circuit and a second set of conductive traces coupled to receive the $\overline{\text{DATA}}$ signal component from the electronic integrated circuit, the first set of conductive traces interleaved with the second set of conductive traces to form a low inductance array connection.

4. An arrangement as defined in claim 1 wherein the array of parallel signal paths comprises
    an array of wirebonds formed between the electronic integrated circuit and a plurality of separate bondpads on the opto-electronic subassembly, with the wirebonds forming the first set disposed in an interleaved configuration with the wirebonds forming the second set; and
    an array of conductive traces coupled between the plurality of separate bondpads and a predetermined location on the opto-electronic subassembly, with the first set of conductive traces interleaved with the second set of conductive traces to form a low inductance array connection.

5. An arrangement as defined in claim 1, further comprising an optical modulator within the opto-electronic subassembly, the DATA and $\overline{\text{DATA}}$ signal components applied as separate inputs to the optical modulator.

6. An arrangement as defined in claim 5 wherein the optical modulator comprises a multi-segment optical modulator with each modulator arm including a plurality of separate modulating sections, each modulating section responsive to a separate low inductance connection in the form of the array of separate signal paths.

* * * * *